United States Patent
Hara

(10) Patent No.: US 12,213,257 B2
(45) Date of Patent: Jan. 28, 2025

(54) SUCTION POSITION ADJUSTMENT DEVICE

(71) Applicant: FUJI CORPORATION, Chiryu (JP)

(72) Inventor: Kenji Hara, Kariya (JP)

(73) Assignee: FUJI CORPORATION, Chiryu (JP)

( * ) Notice: Subject to any disclaimer, the term of this patent is extended or adjusted under 35 U.S.C. 154(b) by 265 days.

(21) Appl. No.: 17/758,753

(22) PCT Filed: Feb. 7, 2020

(86) PCT No.: PCT/JP2020/004912
§ 371 (c)(1),
(2) Date: Jul. 13, 2022

(87) PCT Pub. No.: WO2021/157077
PCT Pub. Date: Aug. 12, 2021

(65) Prior Publication Data
US 2023/0060239 A1 Mar. 2, 2023

(51) Int. Cl.
*H05K 13/04* (2006.01)
*H05K 13/08* (2006.01)

(52) U.S. Cl.
CPC ....... *H05K 13/0452* (2013.01); *H05K 13/041* (2018.08); *H05K 13/0813* (2018.08)

(58) Field of Classification Search
CPC ............. H05K 13/041; H05K 13/0452; H05K 13/0813
See application file for complete search history.

(56) References Cited

U.S. PATENT DOCUMENTS 8,215,005 B2 * 7/2012 Hiraki ............... H01L 21/67144
29/742
10,103,041 B2 * 10/2018 Suzuki ............. H01L 21/67132
(Continued)

FOREIGN PATENT DOCUMENTS

JP 2004-146661 A 5/2004
JP 2005-183412 A 7/2005
(Continued)

OTHER PUBLICATIONS

International Search Report Issued Apr. 21, 2020, in PCT/JP2020/004912, filed on Feb. 7, 2020, 2 pages.

*Primary Examiner* — Paul D Kim
(74) *Attorney, Agent, or Firm* — Oblon, McClelland, Maier & Neustadt, L.L.P.

(57) ABSTRACT

A suction position adjustment device of a component mounter which includes a head having multiple pickup members and that executes simultaneous suction control for substantially simultaneously picking up multiple components with the multiple pickup members by moving the head to a target position that is determined to locate the multiple pickup members on the multiple components supplied from multiple feeders to a supply position. The suction position adjustment device includes an imaging device configured to image the supply position of the feeder from above, a display device, and a control device. The control device configured to control the imaging device so that an upper surface, at the supply position, in the multiple feeders of adjustment targets is captured and display, on the display device, captured multiple upper surface images and multiple pointers superimposed on the multiple upper surface images, when the target position is adjusted.

8 Claims, 12 Drawing Sheets

(56) References Cited

U.S. PATENT DOCUMENTS

| | | |
|---|---|---|
| 2004/0139597 A1 | 7/2004 | Oyama |
| 2008/0283191 A1* | 11/2008 | Nakane .............. H05K 13/0812 156/379 |
| 2013/0110277 A1 | 5/2013 | Takano |
| 2018/0192522 A1* | 7/2018 | Taniguchi .......... H05K 13/0417 |
| 2019/0335631 A1 | 10/2019 | Kawai et al. |

FOREIGN PATENT DOCUMENTS

| | | |
|---|---|---|
| JP | 2010-73929 A | 4/2010 |
| JP | 2013-98289 A | 5/2013 |

* cited by examiner

| SIMULTANEOUS PICKUP ALLOWABLE NOZZLE | | SIMULTANEOUS SUCTION AVAILABILITY | REMARKS |
|---|---|---|---|
| 44A | 44E | YES | — |
| 44B | 44F | NO | SINCE SIMULTANEOUS SUCTION IS NOT AVAILABLE IN CONSIDERATION OF NOZZLE BENDING CORRECTION VALUE |
| 44C | 44G | YES | — |
| 44D | 44H | YES | — |

SUCTION POSITION ADJUSTMENT DEVICE

TECHNICAL FIELD

The present specification discloses a suction position adjustment device applied to a component mounter.

BACKGROUND ART

Conventionally, a component mounter has been proposed which includes a head unit in which two sets of a pair of heads (pickup members) arranged in an X-axis direction as a set are arranged side by side in a Y-axis direction, and components are simultaneously picked up by the pair of heads (for example, see Patent Literature 1). Each head (pickup member) is displaceable in the Y-axis direction, and an arrangement pitch of the heads arranged in the X-axis direction is displaceable. Then, the component mounter corrects the arrangement pitch and the arrangement in the Y-axis direction of the pair of heads arranged in the X-axis direction based on an image of a component take-out position of a tape feeder captured by a suction position recognition unit, and then simultaneously picks up the components by both heads.

PATENT LITERATURE

Patent Literature 1: JP-A-2006-324395

BRIEF SUMMARY

Technical Problem

However, Patent Literature 1 presupposes that the arrangement pitch of the pair of pickup members is displaceable. Patent Literature 1 does not mention adjusting of a target position of the head in the component mounter including the head having multiple pickup members of which arrangement pitches are not displaceable in order to simultaneously perform the pickup of the components by the multiple pickup members.

A main object of the present disclosure is to provide a suction position adjustment device capable of appropriately adjusting a target position of a head used for simultaneous suction control.

Solution to Problem

The present disclosure employs the following means in order to achieve the above-described main object.

A suction position adjustment device of the present disclosure for adjusting a target position of a head, which is used in a component mounter including a component supply section having multiple feeders for supplying components disposed at predetermined intervals to a supply position, the head having multiple pickup members for picking up the components, a lifting and lowering device capable of lifting and lowering the multiple pickup members at substantially same intervals as intervals of multiple components supplied from the multiple feeders, a moving device for moving the head along a plane orthogonal to a lifting and lowering direction of the pickup members, and a mounting control device capable of executing simultaneous suction control for controlling the moving device so that the head moves to a target position that is determined to locate the multiple pickup members on multiple components supplied from the multiple feeders, and controlling the lifting and lowering device so that the multiple pickup members are substantially simultaneously lowered, the suction position adjustment device including: an imaging device configured to image the supply position of the feeder from above; a display device configured to display a captured image that is captured by the imaging device; and a control device configured to control the imaging device so that an upper surface, at the supply position, in the multiple feeders of adjustment targets is imaged and display, on the display device, captured multiple upper surface images and multiple pointers superimposed on the multiple upper surface images, when the target position is adjusted.

According to the suction position adjustment device of the present disclosure, it is possible to appropriately adjust the target position of the head used for the simultaneous suction control.

DESCRIPTION OF EMBODIMENTS

Next, an embodiment of the present disclosure will be described with reference to the drawings.

Figure 1:
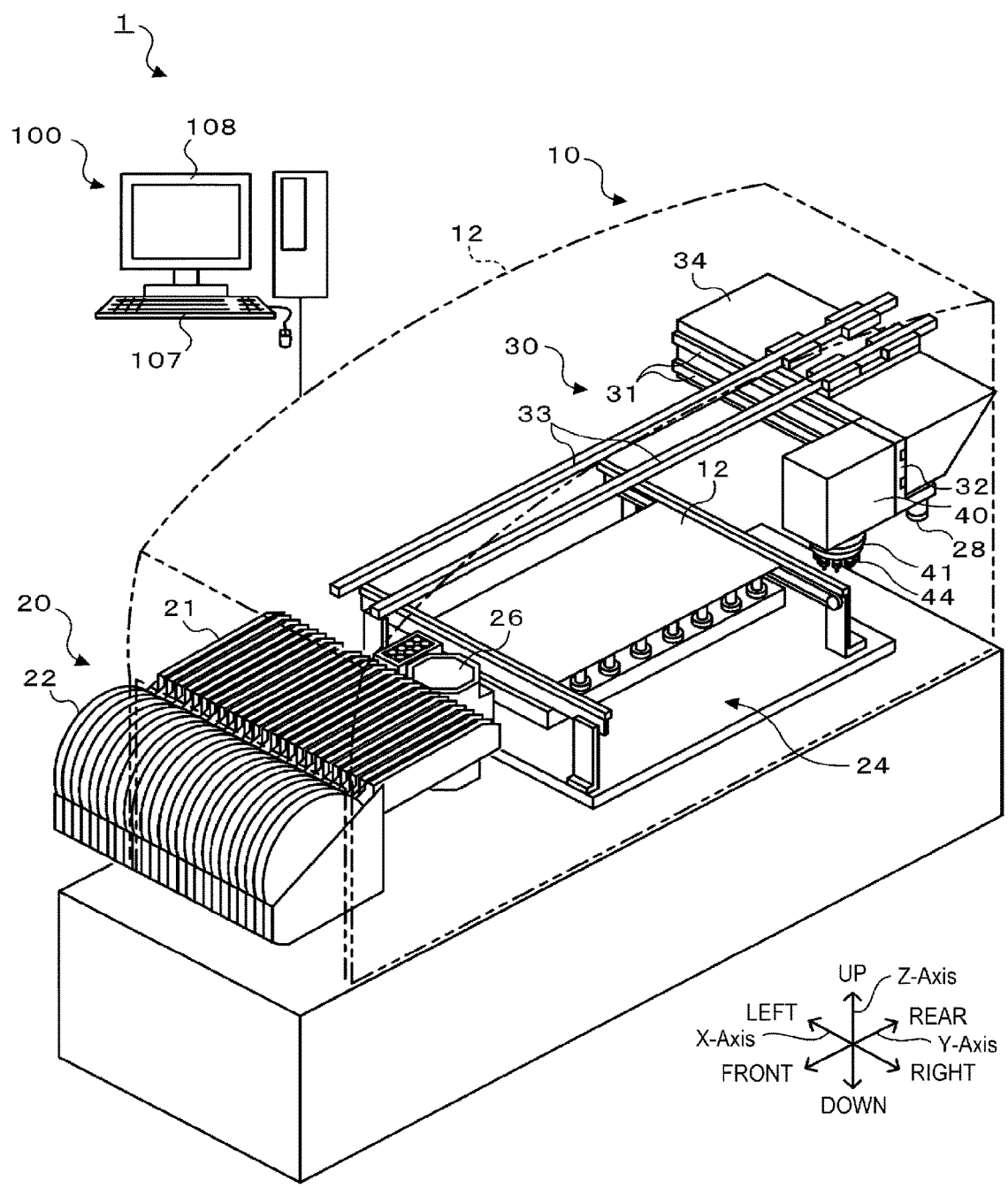
FIG. 1 is a schematic configuration view of a component mounting system including a component mounter.
Figure 2:
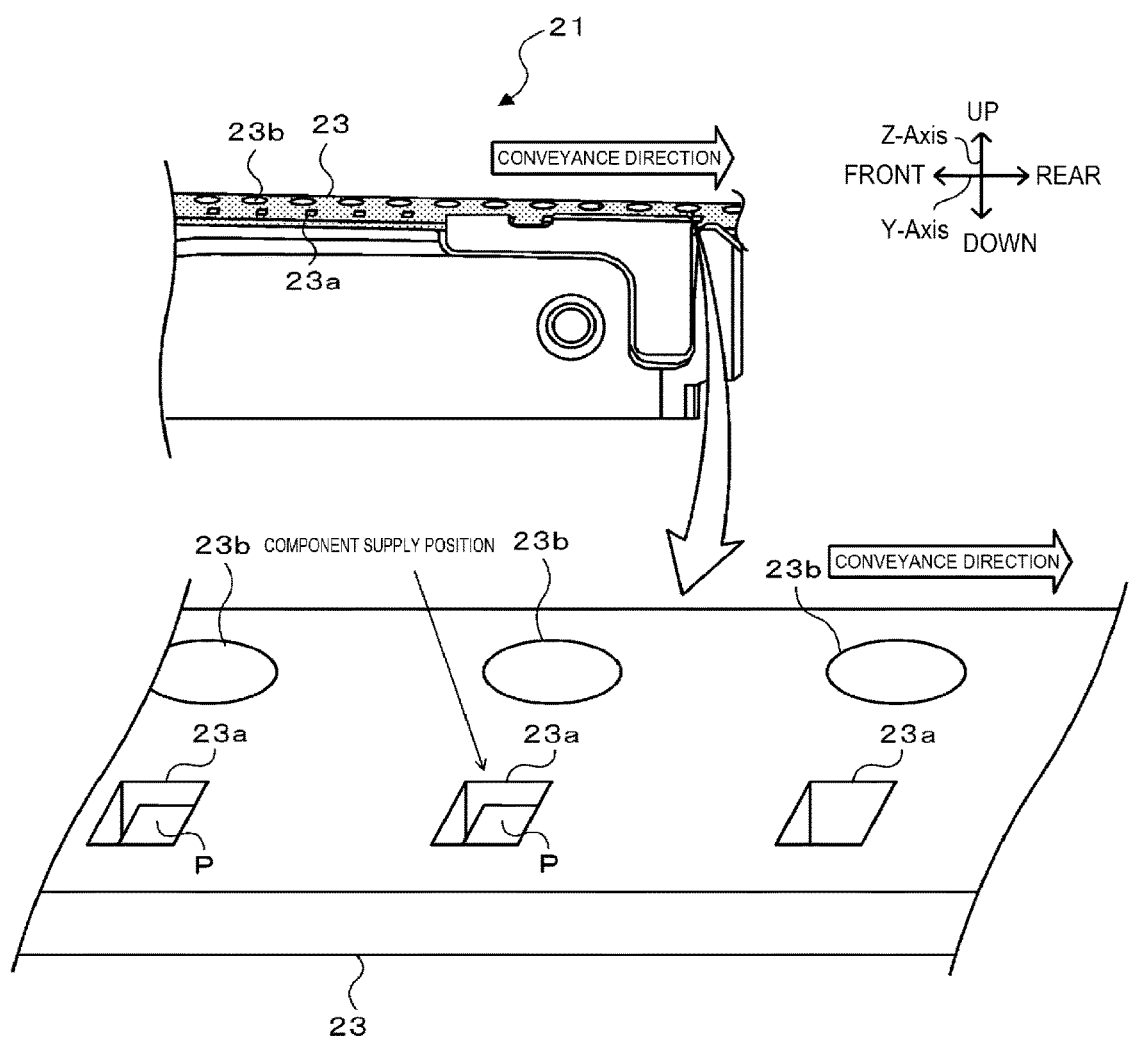
FIG. 2 is a partially enlarged view of the vicinity of a component supply position of a feeder.
Figure 3:
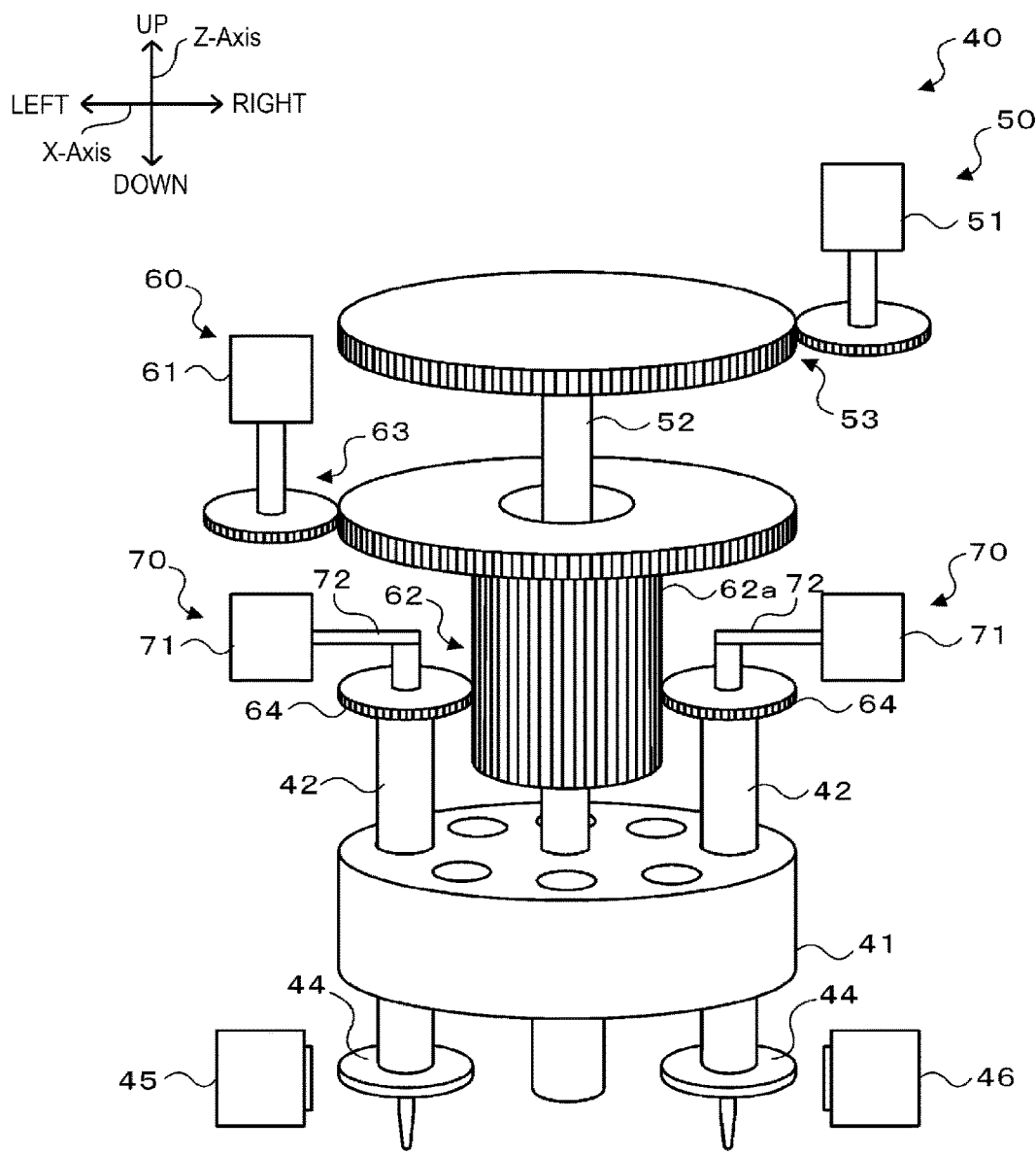
FIG. 3 is a schematic configuration view of a mounting head.
Figure 4:
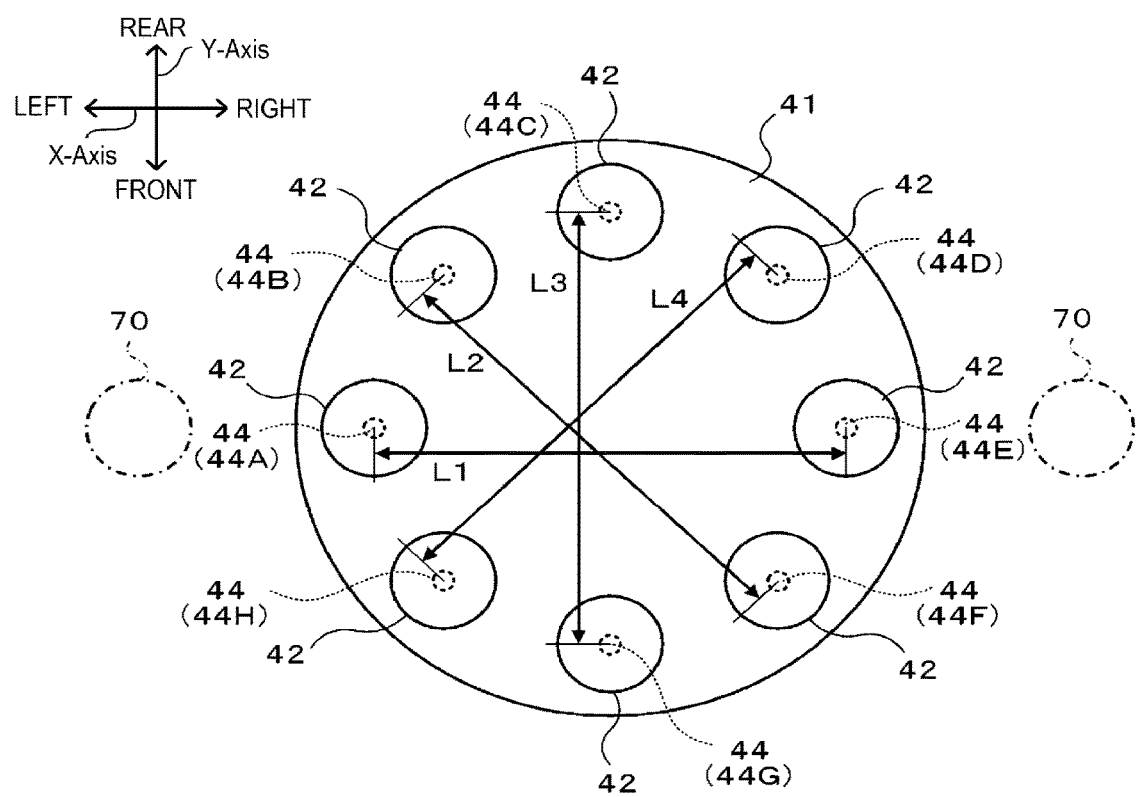
FIG. 4 is an explanatory view for explaining an arrangement of nozzle holders.
Figure 5:
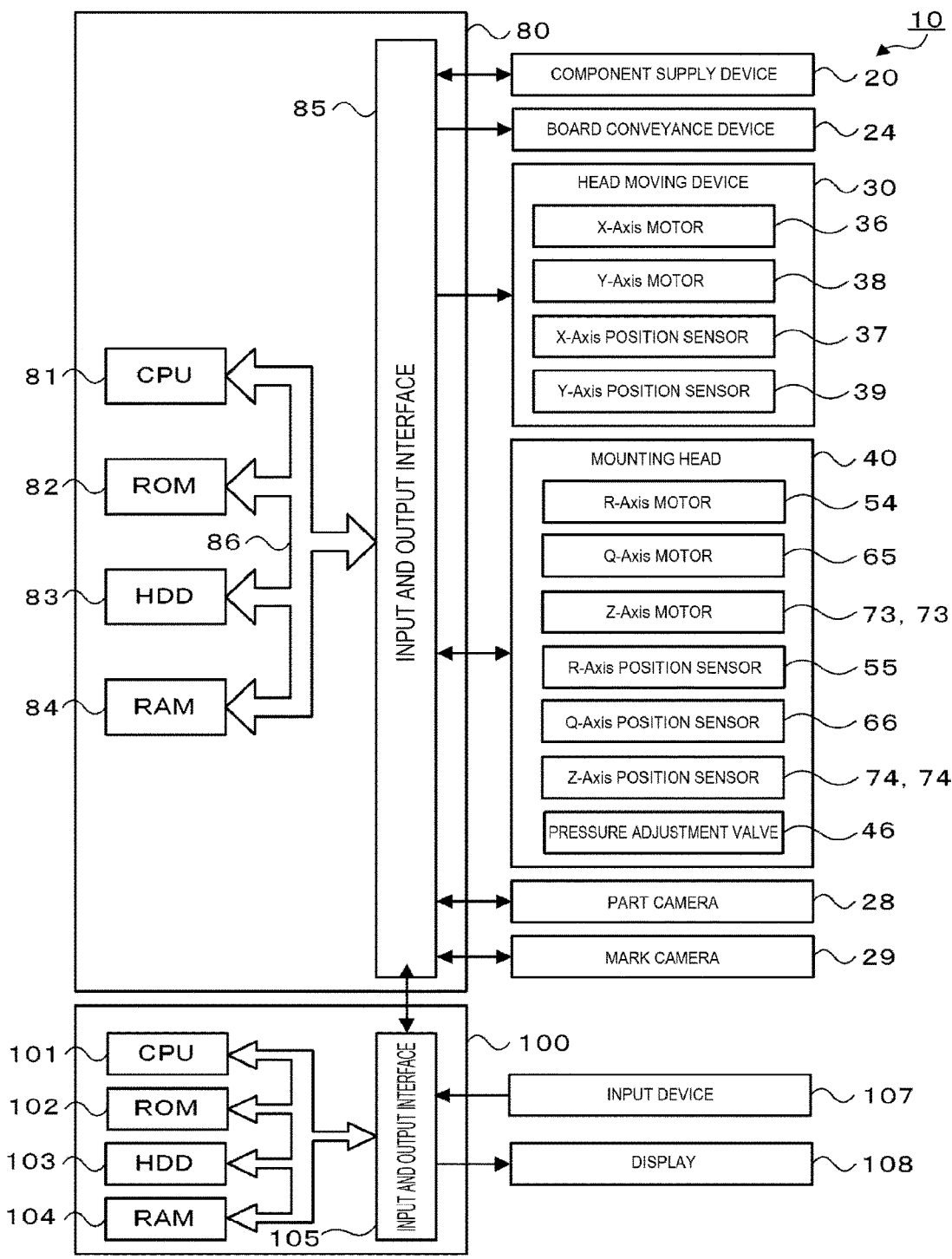
FIG. 5 is an explanatory diagram illustrating an electrical connection relationship between a control device and a management device of the component mounter.

FIG. 1 is a schematic configuration view of a component mounting system including a component mounter. FIG. 2 is a partially enlarged view of the vicinity of a component supply position of a feeder. FIG. 3 is a schematic configuration view of a mounting head. FIG. 4 is an explanatory view for explaining an arrangement of nozzle holders. FIG. 5 is an explanatory diagram illustrating an electrical connection relationship between a control device and a management device of the component mounter. A left-right direction in FIG. 1 is an X-axis direction, a front (front)-rear (back) direction is a Y-axis direction substantially orthogonal to the X-axis direction, and an up-down direction is a Z-axis direction substantially orthogonal to the X-axis direction and the Y-axis direction (horizontal plane).

As illustrated in FIG. 1, component mounting system 1 includes component mounter 10 and management device 100 that controls the entire system. In the embodiment, component mounting system 1 includes multiple component mounters 10 arranged in a conveyance direction of board S.

As illustrated in FIG. 1, component mounter 10 includes housing 12, component supply section 20, board conveyance device 24, head moving device 30, mounting head 40, and control device 80 (see FIG. 5). In addition to these, component mounter 10 also includes part camera 26, mark camera 28, and the like. Part camera 26 is provided between component supply section 20 and board conveyance device 24, and is for imaging component P picked up by suction nozzle 44 of mounting head 40 from below. Mark camera 28 is provided on mounting head 40 for imaging and reading a reference mark attached to board S from above.

As illustrated in FIG. 1, component supply section 20 is provided in a front portion of component mounter 10 and has multiple feeders 21 arranged along the X-axis direction (left-right direction). Feeder 21 has tape reel 22 on which tape 23 is wound, and feeds tape 23 from tape reel 22 by a tape feeding mechanism (not illustrated) to feed tape 23 to a component supply position. Cavities 23a and sprocket holes 23b are formed in tape 23 at predetermined intervals along a longitudinal direction thereof. Component P is accommodated in cavity 23a. A sprocket of the tape feeding mechanism is engaged with sprocket hole 23b. Feeder 21 drives the sprocket by a predetermined rotation amount by a motor to feed tape 23 engaged with the sprocket by a predetermined amount, thereby sequentially supplying components P accommodated in tape 23 to the component supply position. Component P accommodated in tape 23 is protected by a film covering a surface of tape 23, and is in an exposed state at the component supply position when the film is peeled off before the component supply position, so as to be picked up by suction nozzle 44.

Board conveyance device 24 has a pair of conveyor belts that are provided with intervals in the front-rear direction of FIG. 1 and spanned in the X-axis direction (left-right direction). Board S is conveyed from left to right in the drawing by the conveyor belts of board conveyance device 24.

Head moving device 30 moves mounting head 40 in the XY-axis directions (front-rear and left-right directions), and includes X-axis slider 32 and Y-axis slider 34, as illustrated in FIG. 1. X-axis slider 32 is supported by a pair of upper and lower X-axis guide rails 31 provided on a front surface of Y-axis slider 34 so as to extend in the X-axis direction (left-right direction), and is movable in the X-axis direction by the driving of X-axis motor 36 (see FIG. 5). Y-axis slider 34 is supported by a pair of left and right Y-axis guide rails 33 provided on an upper stage portion of housing 12 so as to extend in the Y-axis direction (front-rear direction), and is movable in the Y-axis direction by the driving of Y-axis motor 38 (see FIG. 5). The position of X-axis slider 32 in the X-axis direction is detected by X-axis position sensor 37 (see FIG. 5), and the position of Y-axis slider 34 in the Y-axis direction is detected by Y-axis position sensor 39 (see FIG. 5). Mounting head 40 is attached to X-axis slider 32. Therefore, mounting head 40 is movable along an XY-plane (horizontal plane) by driving and controlling head moving device 30 (X-axis motor 36 and Y-axis motor 38).

As illustrated in FIG. 3, mounting head 40 includes head main body 41, multiple nozzle holders 42 (eight in the embodiment), multiple suction nozzles 44 (eight in the embodiment), R-axis driving device 50, Q-axis driving device 60, and two Z-axis driving devices 70.

Head main body 41 is a rotating body that can be rotated by R-axis driving device 50. Nozzle holders 42 are arranged at predetermined angle intervals (in the embodiment, at intervals of 45 degrees) on the same circumference about the rotation axis of head main body 41, and are supported by head main body 41 so as to be freely capable of lifting and lowering. Suction nozzle 44 is mounted on a tip portion of nozzle holder 42. Suction nozzle 44 has a suction port at a tip, and picks up component P by a negative pressure supplied from a negative pressure source (not illustrated) to the suction port via pressure adjustment valve 46 (see FIG. 5). Suction nozzle 44 is detachable from nozzle holder 42, and is exchanged with a nozzle suitable for the suction of component P according to the type thereof to be picked up.

R-axis driving device 50 turns (revolves) multiple nozzle holders 42 (multiple suction nozzles 44) in the circumference direction around a center axis of head main body 41. As illustrated in FIG. 3, R-axis driving device 50 includes R-axis motor 51, R-axis 52 extending in an axial direction from the center axis of head main body 41, and transmission gears 53 for transmitting the rotation of R-axis motor 51 to R-axis 52. R-axis driving device 50 causes head main body 41 to rotate by causing R-axis motor 51 to rotationally drive R-axis 52 by way of transmission gears 53. Each nozzle holder 42 turns (revolves) in the circumference direction together with suction nozzle 44 by the rotation of head main body 41. In addition, R-axis driving device 50 includes R-axis position sensor 55 (see FIG. 5) for detecting the rotational position of R-axis 52, that is, a turning position of each nozzle holder 42 (suction nozzle 44).

Q-axis driving device 60 causes each nozzle holder 42 (each suction nozzle 44) to rotate (spin) around its own center axis. As illustrated in FIG. 3, Q-axis driving device 60 includes Q-axis motor 61, cylindrical gear 62, transmission gear 53, and Q-axis gear 64. Cylindrical gear 62 is inserted into an inside thereof so that R-axis 52 is coaxial and relatively rotatable, and thereby external teeth 62a of spur teeth are formed on an outer peripheral surface thereof. Transmission gear 53 transmits the rotation of Q-axis motor 61 to cylindrical gear 62, Q-axis gear 64 is provided on an upper portion of each nozzle holder 42 and slidably meshes with external teeth 62a of cylindrical gear 62 in the Z-axis direction (up-down direction). Q-axis driving device 60 rotationally drives cylindrical gear 62 by Q-axis motor 61 via transmission gear 53, so that each Q-axis gear 64 meshing with external teeth 62a of cylindrical gear 62 can be collectively rotated in the same direction. Each nozzle holder 42 rotates (spins) about its own center axis together with suction nozzle 44 by the rotation of Q-axis gear 64. In addition. Q-axis driving device 60 includes Q-axis position sensor 65 (see FIG. 5) for detecting the rotational position of Q-axis gear 64, that is, the rotational position of each nozzle holder 42 (suction nozzle 44).

Each Z-axis driving device 70 is configured to be able to individually lift and lower nozzle holder 42 at two portions on a turning (revolving) track of nozzle holder 42. Suction nozzle 44 mounted on nozzle holder 42 lifts and lowers together with nozzle holder 42. In the present embodiment, each Z-axis driving device 70 is disposed so as to be capable of lifting and lowering two nozzle holders 42 (suction nozzles 44) that pass through the center axis of head main body 41 and are located on a line parallel to the arrangement direction (X-axis direction) of feeder 21. In the present embodiment, as illustrated in FIG. 4, each Z-axis driving device 70 is capable of lifting and lowering a set of suction nozzles 44A and 44E, a set of suction nozzles 44B and 44F, a set of suction nozzles 44C and 44G, and a set of suction nozzles 44O and 44H among eight suction nozzles 44A to 44H mounted on eight nozzle holders 42 arranged in the circumference direction. Since eight suction nozzles 44A to 44H constituting these are arranged on the same circumference about the rotation axis of head main body 41, each nozzle set has substantially the same nozzle-to-nozzle distances L1 to L4.

Figure 6:
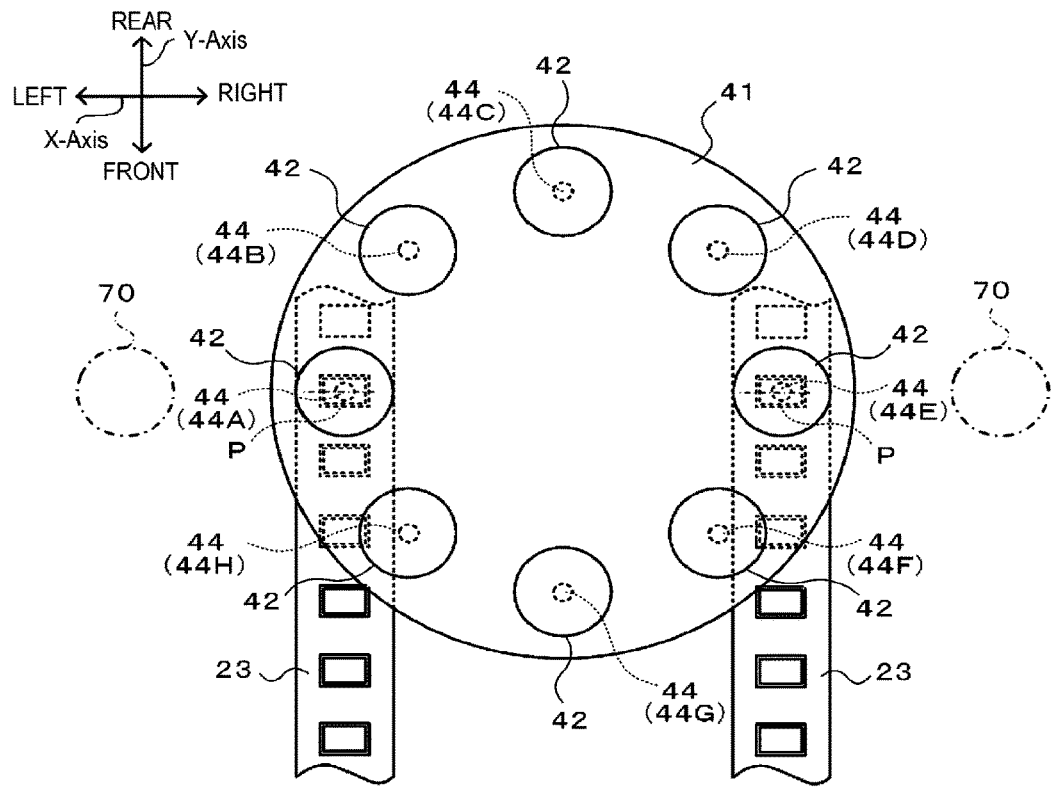
FIG. 6 is an explanatory view illustrating a state of a simultaneous suction operation.

Each Z-axis driving device 70 includes Z-axis slider 72 and Z-axis motor 71 for lifting and lowering Z-axis slider 72, as illustrated in FIG. 3. In addition, each Z-axis driving device 70 also includes Z-axis position sensor 73 (see FIG. 5) for detecting a lifting and lowering position of corresponding Z-axis slider 72, that is, a lifting and lowering position of corresponding nozzle holder 42 (suction nozzle 44). Each Z-axis driving device 70 drives each Z-axis motor 71 to lift and lower corresponding Z-axis slider 72, thereby contacting nozzle holder 42 located below Z-axis slider 72 to integrally lift and lower nozzle holder 42 with suction nozzle 44. Two Z-axis driving devices 70 may lift and lower Z-axis slider 72 using a linear motor as Z-axis motor 71, or may lift and lower Z-axis slider 72 using a rotation motor and a feeding screw mechanism. Each Z-axis driving device 70 may lift and lower Z-axis slider 72 using an actuator such as an air cylinder instead of Z-axis motor 71. As described above, mounting head 40 according to the embodiment includes two Z-axis driving devices 70 each capable of individually lifting and lowering nozzle holder 42 (suction nozzle 44), and can individually perform the suction operation of component P by suction nozzle 44 using each Z-axis driving device 70. In addition, as illustrated in FIG. 6, mounting head 40 of the embodiment can simultaneously lower two suction nozzles 44 to simultaneously pick up two components P by supplying two components P from corresponding feeder 21 so as to be arranged in the X-axis direction (left-right direction) at substantially the same interval as two suction nozzles 44 that can be lifted and lowered by two Z-axis driving devices 70. Hereinafter, the suction operation for picking up components P one by one to suction nozzle 44 will be referred to as an individual suction operation, and the suction operation for simultaneously picking up two components P to two suction nozzles 44 will be referred to as a simultaneous suction operation.

As illustrated in FIG. 5, control device 80 is configured as a microprocessor centered on CPU 81 and includes, in addition to CPU 81, ROM 82, HDD 83, RAM 84, and input and output interface 85. These constituent elements are connected to one another via bus 86. Various detection signals from X-axis position sensor 37, Y-axis position sensor 39, R-axis position sensor 55, Q-axis position sensor 65, Z-axis position sensor 73, and the like are input to control device 80. In addition, image signals and the like from part camera 26 and mark camera 28 are also input to control device 80 via input and output interface 95. On the other hand, various control signals are output from control device 80 to feeder 21, board conveyance device 24, X-axis motor 36, Y-axis motor 38, R-axis motor 51, Q-axis motor 61, Z-axis motor 71, pressure adjustment valve 48, part camera 26, mark camera 28, and the like.

Management device 100 is, for example, a general-purpose computer, and as illustrated in FIG. 5, includes CPU 101, ROM 102, HDD 103 (storage device), RAM 104, input and output interface 105, and the like. Input signals from input device 107 including a mouse and a keyboard are input to management device 100 via input and output interface 105. A display signal to display 108 is output from management device 100 via input and output interface 105. HDD 103 stores production programs of boards S and job information including other production information. Herein, the production program refers to a program that determines which component P is to be mounted on which board S in which order and how many boards S on which the components are mounted in such a manner is manufactured, in component mounter 10. In addition, the production information includes component information as to component P to be mounted on board S, feeder information as to feeder 21 to be used (component supply position), head information as to mounting head 40 to be used, a component mounting position on board 5, and the like. Management device 100 is communicably connected to control device 80 of component mounter 10, and exchanges various information and control signals.

Next, operations of component mounter 10 according to the embodiment configured as described above will be described. The operations of component mounter 10 mainly include a suction operation (individual suction operation or simultaneous suction operation) for picking up component P supplied by feeder 21 to suction nozzle 44, and a mounting operation for mounting component P picked up by suction nozzle 44 on board S.

The suction operation is executed after board S is carried in and positioned by board conveyance device 24. In a case where the suction operation is executed, CPU 81 of control device 80 first controls head moving device 30 and thereby mounting head 40 moves to a target position of mounting head 40 that is determined so that suction nozzle 44 (suction target nozzle) of the suction target is located above the component supply position of feeder 21 that supplies component P (suction target component) of the suction target. Then, CPU 81 controls corresponding Z-axis moving device 70 so that the suction target nozzle is lowered, and controls pressure adjustment valve 46 so that the negative pressure is supplied to the suction port of the suction target nozzle. Therefore, the suction target component is picked up by the suction target nozzle. In a case where the individual suction operation is performed, CPU 81 moves mounting head 40 to the target position and lowers one suction target nozzle by one Z-axis driving device 70, so that the suction target component is picked up by the suction target nozzle. In addition, in a case where the simultaneous suction operation is executed, CPU 81 moves mounting head 40 to the target position and simultaneously lowers the two suction target nozzles by two Z-axis driving devices 70, so that the suction target components are simultaneously picked up by the two suction target nozzles. In addition, if an expected number of components P is not picked up by multiple suction nozzles 44 of mounting head 40, CPU 81 rotates head main body 41 by a predetermined amount until the expected number of components P are picked up, and repeats the suction operation with suction nozzles 44 to be picked up next as the suction target nozzles.

The mounting operation is executed after the suction operation is completed. In a case where the mounting operation is performed. CPU 81 first controls head moving device 30 so that mounting head 40 moves above part camera 26, so that component P picked up by suction nozzle 44 by part camera 26 is imaged from below. Subsequently, CPU 81 processes the captured image to calculate a positional deviation amount (suction deviation amount) of component P picked up by each suction nozzle 44, and corrects a mounting position of board S based on the calculated positional deviation amount. Next, CPU 81 sets the target position of mounting head 40 so that component. P (mounting target component) picked up by suction nozzle 44 (mounting target nozzle) of the mounting target is located above the corrected mounting position, and controls head moving device 30 so that mounting head 40 moves to the set target position. Then, CPU 81 controls corresponding Z-axis moving device 70 so that the mounting target nozzle lowers, and controls pressure adjustment valve 46 so that the supply of the negative pressure to the suction port of the mounting target nozzle is canceled. Therefore, the mounting target component is mounted on the mounting position of board S. In addition, if any unmounted component P remains in any of multiple suction nozzles 44 of mounting head 40, CPU 81 repeats the mounting operation with suction nozzle 44 to be mounted next as the mounting target nozzle until all components P are mounted.

Figure 7:
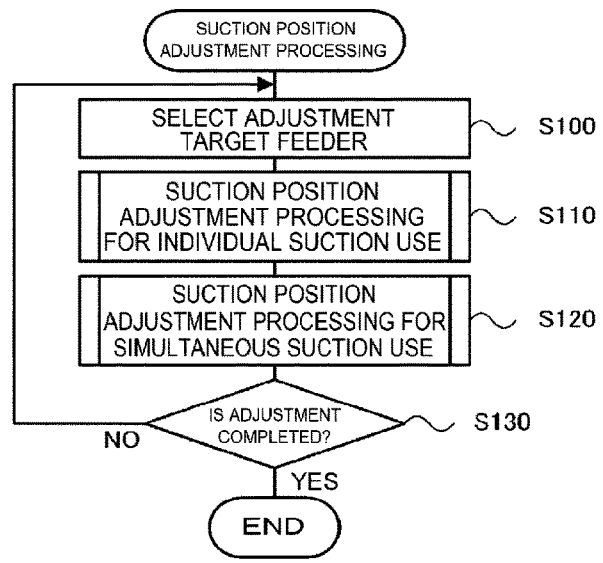
FIG. 7 is a flowchart illustrating an example of suction position adjustment processing.

Next, processing for adjusting the target position of mounting head 40 used in the suction operation will be described. FIG. 7 is a flowchart illustrating an example of the suction position adjustment processing executed by CPU 101 of management device 100. The suction position adjustment processing is performed before the production in component mounter 10 is started.

In the suction position adjustment processing, CPU 101 of management device 100 first receives a selection of feeder 21 (adjustment target feeder) of the adjustment target (S100). This processing is performed by an operator selecting one of feeders 21 mounted on component supply section 20 using input device 107. Next, CPU 101 performs the suction position adjustment processing for individual suction (S110) and the suction position adjustment processing for simultaneous suction (S120) on the received adjustment target feeder. Then, CPU 101 determines whether there is another feeder 21 of which the target suction position is to be adjusted (S130), if it is determined that there is another feeder 21, the processing returns to S100, whereas if it is determined that there is no other feeder 21, and terminates the suction position adjustment processing.

Figure 8:
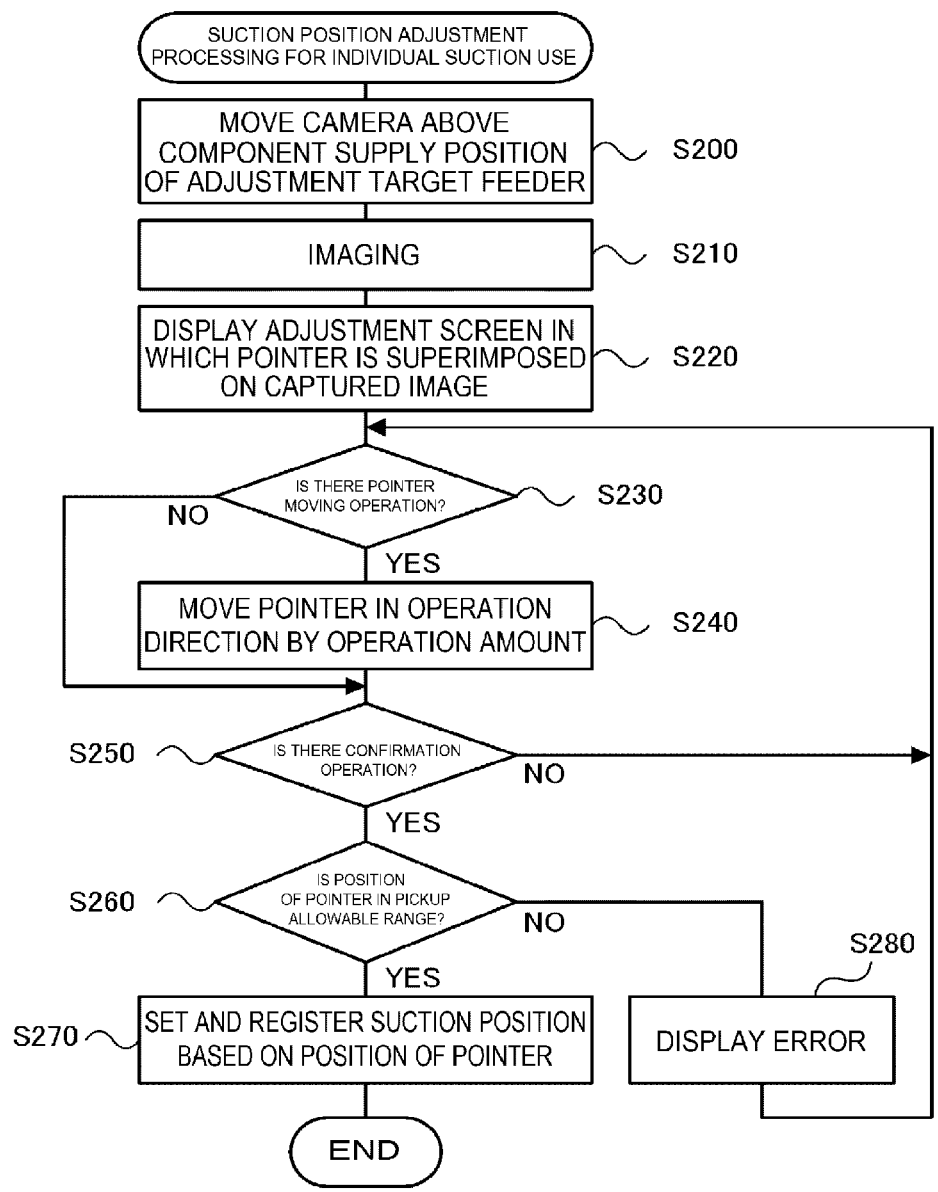
FIG. 8 is a flowchart illustrating an example of suction position adjustment processing for individual suction.
Figure 9:
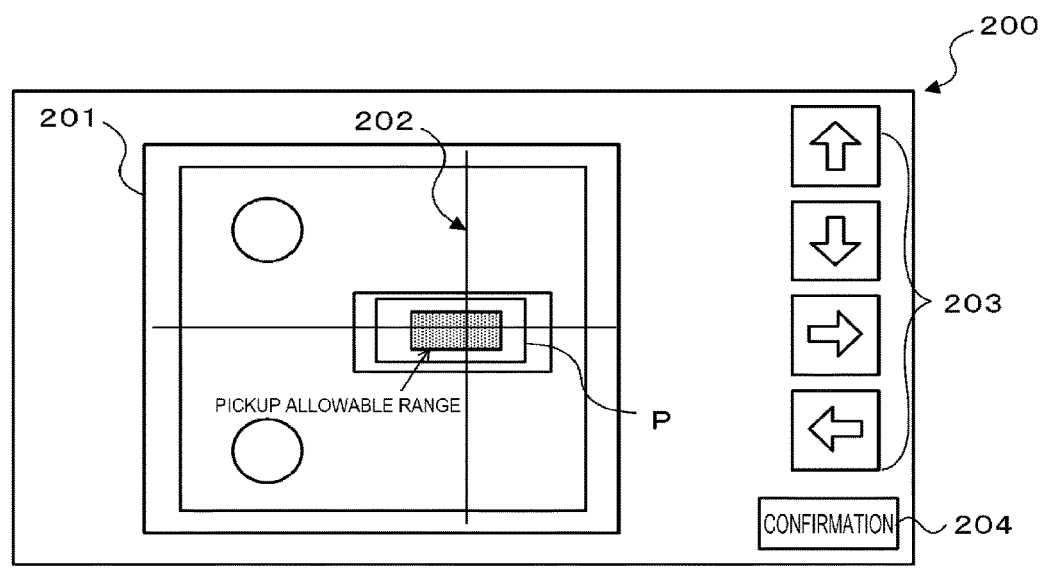
FIG. 9 is an explanatory view illustrating an example of an adjustment screen for individual suction.

The suction position adjustment processing for individual suction is processing for adjusting the target position of mounting head 40 used in the individual suction operation, and is performed by executing the flowchart illustrated in FIG. 8. In the suction position adjustment processing for individual suction, CPU 101 first controls head moving device 30 so that mark camera 28 moves above the component supply position of the adjustment target feeder (S200), and transmits a control instruction to control device 80 of component mounter 10 to control mark camera 28 to image the component supply position from above with mark camera 28 (S210). Subsequently, CPU 101 acquires the obtained captured image from control device 80, and displays, on display 108, an adjustment screen for individual suction in which a pointer is superimposed on the captured image (S220). FIG. 9 is an explanatory view illustrating an example of an adjustment screen for individual suction. As illustrated in the drawing, adjustment screen 200 for individual suction includes captured image 201 of the component supply position of the adjustment target feeder, cross-shaped pointer 202 superimposed on captured image 201, operation button 203 for moving pointer 202 in the up-down and left-right directions, and confirmation button 204. A center of the cross of pointer 202 indicates the suction position of suction nozzle 44. In addition, adjustment screen 200 also displays a pickup allowable range, which is a range in which suction nozzle 44 can normally perform the pickup, of the upper surface of component P recognized in captured image 201. When adjustment screen 200 is displayed. CPU 101 determines whether operation button 203 is operated by input device 107 such as a mouse (S230). If it is determined that operation button 203 is operated, CPU 101 moves pointer 202 in an operation direction by an operation amount on adjustment screen 200 (S240). CPU 101 determines whether confirmation button 204 is operated by input device 107 such as a mouse (S250). If it is determined that confirmation button 204 is not operated, the processing returns to S230, and if it is determined that confirmation button 204 is operated, CPU 101 determines whether the position indicated by pointer 202 (suction position of suction nozzle 44) is within the pickup allowable range (S260). If it is determined that the position of pointer 202 is within the pickup allowable range, CPU 101 sets the target position of mounting head 40 used in the individual suction operation based on the position of pointer 202, registers the set target position in HDD 83 (storage device) (S270), and terminates the suction position adjustment processing for individual suction. On the other hand, if it is determined that the position of pointer 202 is not within the pickup allowable range, CPU 101 displays an error on display 108 (S280), and returns to S230.

Figure 10:
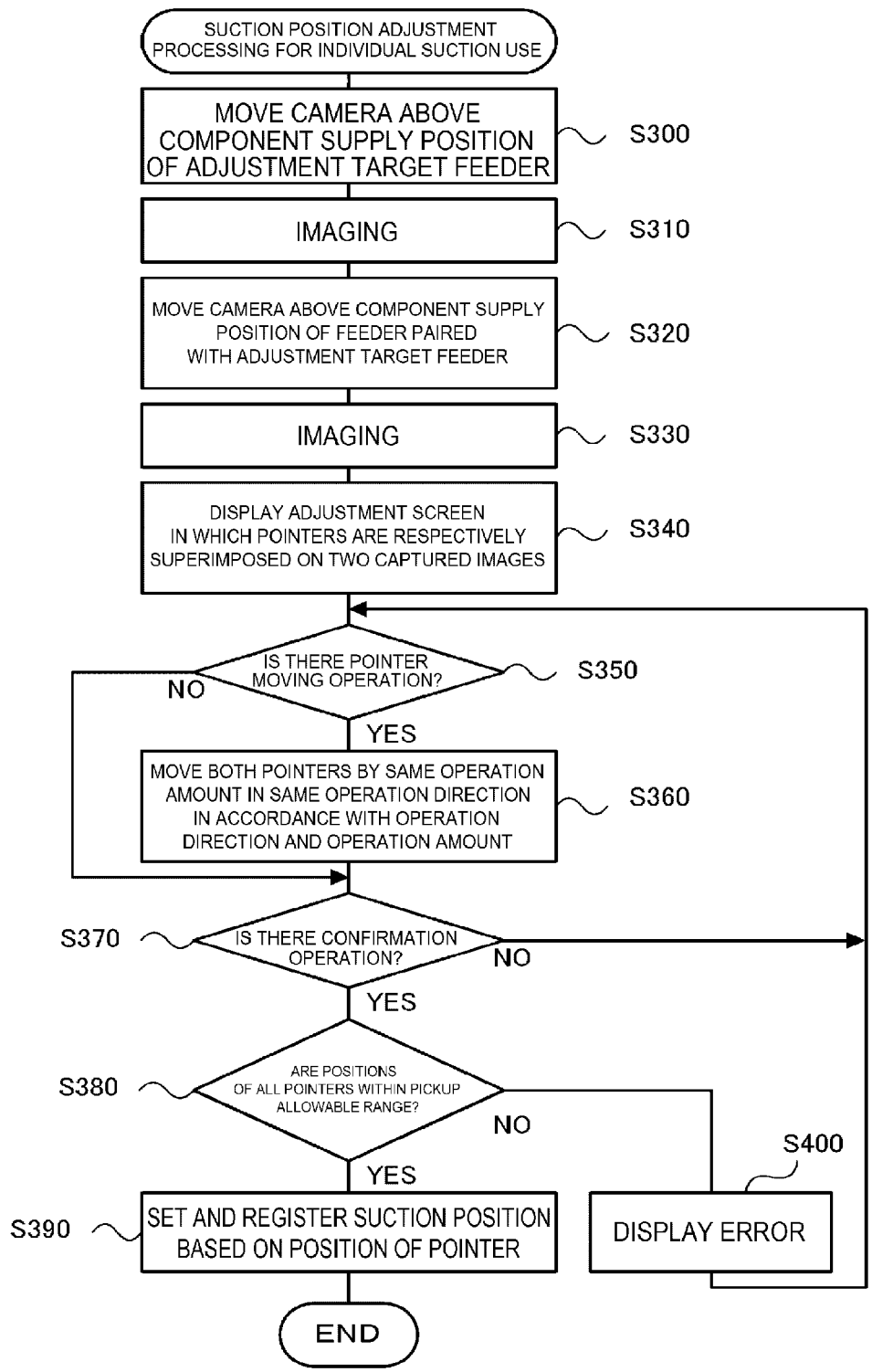
FIG. 10 is a flowchart illustrating an example of suction position adjustment processing for simultaneous suction.
Figure 11:
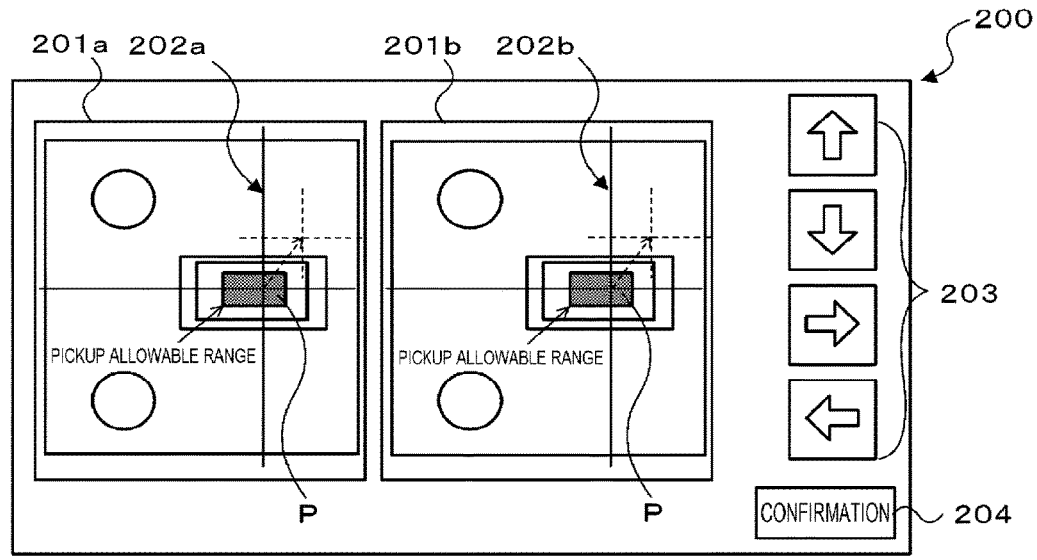
FIG. 11 is an explanatory view illustrating an example of an adjustment screen for simultaneous suction.

The suction position adjustment processing for simultaneous suction is processing for adjusting the target position of mounting head 40 used in the simultaneous suction operation, and is performed by executing the flowchart illustrated in FIG. 10. In the suction position adjustment processing for simultaneous suction, CPU 101 first controls head moving device 30 so that mark camera 28 moves above the component supply position of the adjustment target feeder (S300), and transmits the control instruction for controlling mark camera 28 to image the component supply position with mark camera 28 from above (S310) to control device 80 of component mounter 10, similarly to S200 and S210. CPU 101 may omit the processing of S300 and 8310, and may use the captured image obtained in the processing of S200 and S210. Subsequently, CPU 101 controls head moving device 30 so that mark camera 28 moves to above the component supply position of feeder 21 supplying component P picked up simultaneously with component P supplied from the adjustment target feeder, that is, feeder 21 paired with the adjustment target feeder (S320), and transmits the control instruction for controlling mark camera 28 to image the component supply position from above with mark camera 28 (S330) to control device 80 of component mounter 10. CPU 101 acquires the obtained two captured images from control device 80, and displays, on display 108, the adjustment screen for simultaneous suction, in which pointers are respectively superimposed on the two captured images (S340). FIG. 11 is an explanatory view illustrating an example of the adjustment screen for simultaneous suction. As illustrated in the drawing, adjustment screen 200 for simultaneous suction includes captured images 201a and 201b of respective component supply positions of feeder 21 that are to be paired with the adjustment target feeder, cross-shaped pointers 202a and 202b that are respectively superimposed on captured images 201a and 201b, operation button 203 for moving pointers 202a and 202b in the up-down and left-right directions, and confirmation button 204. A center of the cross of each of pointers 202a and 202b indicates the suction position of each suction nozzle 44. In addition, adjustment screen 200 also displays the pickup allowable range, which is a range in which each suction nozzle 44 can normally pick up the upper surface of component P each recognized in captured images 201a and 201b.

If adjustment screen 200 is displayed, CPU 101 determines whether operation button 203 is operated by input device 107 such as the mouse (S350). If it is determined that operation button 203 is operated, CPU 101 moves pointers 202a and 202b by the same operation amount in the same operation direction on adjustment screen 200 in accordance with the operation direction and the operation amount thereof (S360). In the present embodiment, mounting head 40 includes multiple sets of two suction nozzles 44 (nozzle sets) on the same circumference, which have nozzle-to-nozzle distances substantially coincident with component-to-component distances of two components P to be simultaneously picked up. Multiple suction nozzles 44 cannot move relative to each other in the XY directions, and move by the same amount in the same direction in accordance with the movement of mounting head 40. Therefore, position alignment of two suction nozzles 44 with respect to two components P to be simultaneously picked up is performed by the movement of mounting head 40. Therefore, the adjustment of the target position for simultaneous suction is performed by respectively moving pointers 202a and 202b to be superimposed on the captured images 201a and 201b of the component supply positions by the same operation amount in the same operation direction.

CPU 101 determines whether confirmation button 204 is operated by input device 107 such as the mouse (S370). If it is determined that confirmation button 204 is not operated, the processing returns to S350, and if it is determined that confirmation button 204 is operated, CPU 101 determines whether the positions indicated by respective pointers 202 (suction positions of respective suction nozzles 44) are all within the corresponding pickup allowable range (S380). If it is determined that the positions of respective pointers 202 are all within the pickup allowable range, CPU 101 sets the target position of mounting head 40 used in the simultaneous suction operation based on the positions of respective pointers 202, registers the set target position in HDD 83 (storage device) (S390), and terminates the suction position adjustment processing for simultaneous suction. On the other hand, if it is determined that any of the positions of respective pointers 202 is not within the pickup allowable range, CPU 101 displays an error on display 108 (S400), and the processing returns to S350.

Next, processing for determining whether the simultaneous suction operation of two suction nozzles 44 is available will be described. In the present embodiment, as described above, mounting head 40 includes multiple sets of two suction nozzles 44 (nozzle sets) on the same circumference, which have nozzle-to-nozzle distances substantially coincident with the component-to-component distances of two components P to be simultaneously picked up. However, if suction nozzle 44 and nozzle holder 42 are inclined or bent with respect to the rotation axis of head main body 41, the nozzle-to-nozzle distance may deviate with respect to the component-to-component distance, so that the simultaneous suction operation may not be executed. Therefore, in the present embodiment. CPU 101 of management device 100 measures the nozzle-to-nozzle distance for each nozzle set in advance, stores the nozzle-to-nozzle distance in HDD 83 (storage device), and determines whether the simultaneous suction operation can be executed based on the nozzle-to-nozzle distance. In the present embodiment, HDD 83 stores nozzle-to-nozzle distance L1 of the set of suction nozzles 44A and 44E, nozzle-to-nozzle distance L2 of the set of suction nozzles 44B and 44F, nozzle-to-nozzle distance L3 of the set of suction nozzles 44C and 44, and nozzle-to-nozzle distance L4 of the set of suction nozzles 44D and 44H.

Figure 12:
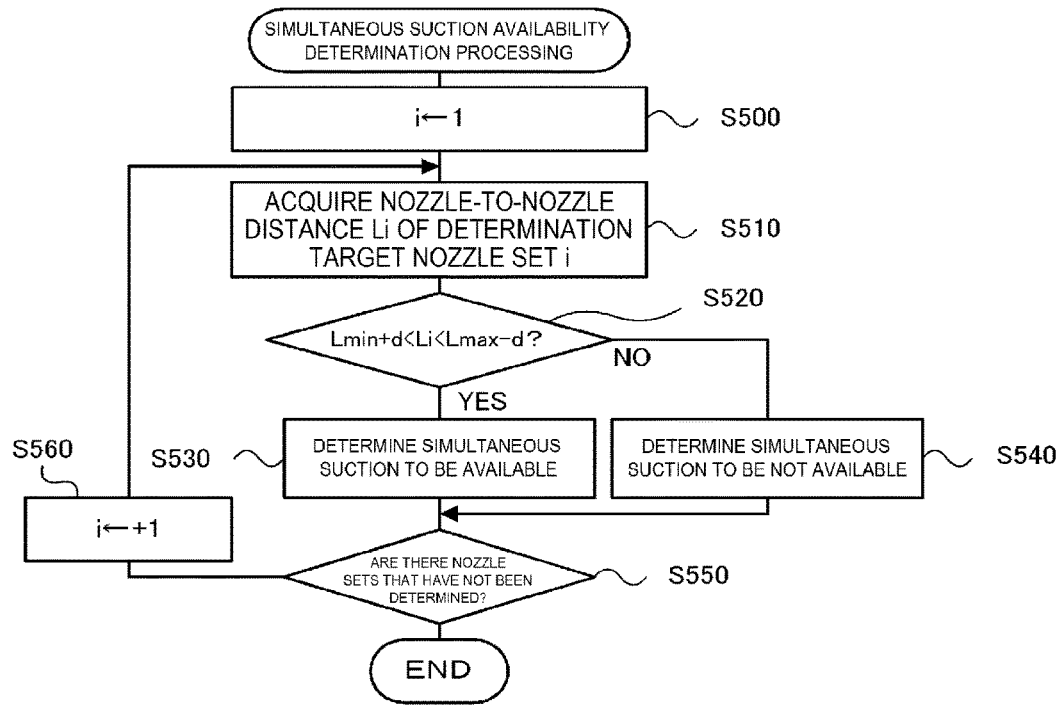
FIG. 12 is a flowchart illustrating an example of simultaneous suction availability determination processing.
Figures 13, 14:
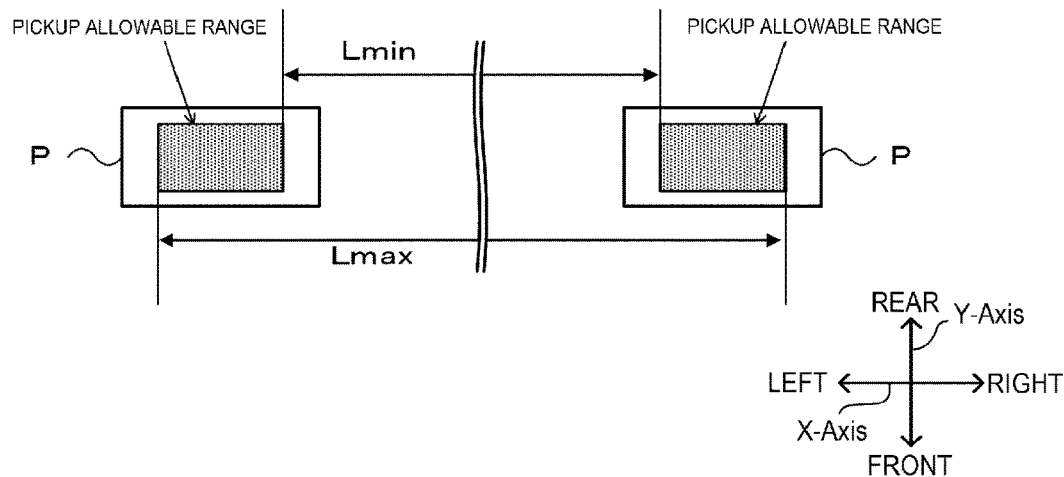
FIG. 13 is an explanatory view for explaining minimum allowable nozzle-to-nozzle distance Lmin and maximum allowable nozzle-to-nozzle distance Lmax that can be simultaneously picked up.
FIG. 14 is an explanatory diagram illustrating an example of determination results of the simultaneous suction availability determination.

FIG. 12 is a flowchart illustrating an example of the simultaneous suction availability determination processing. CPU 101 of management device 100 first initializes variable i to value 1 (S500), and acquires nozzle-to-nozzle distance L1 of determination target nozzle set i (S510). The processing in S510 is performed by reading information measured in advance for each nozzle set i and stored in HDD 83 (storage device). Subsequently, CPU 101 determines whether acquired nozzle-to-nozzle distance Li is larger than distance (Lmin+d) which is obtained by adding nozzle diameter (diameter) d of suction nozzle 44 to minimum allowable nozzle-to-nozzle distance Lmin which is allowable, and smaller than distance (Lmax−d) which is obtained by subtracting nozzle diameter d from maximum allowable nozzle-to-nozzle distance Lmax (S520). This processing is for determining whether the suction positions of two suction nozzles 44 cannot be in a state of being simultaneously included in the pickup allowable range of two components P no matter how the target position of mounting head 40 is adjusted in the suction position adjustment processing for simultaneous suction. FIG. 13 is an explanatory view for explaining minimum allowable nozzle-to-nozzle distance Lmin and maximum allowable nozzle-to-nozzle distance Lmax that can be simultaneously picked up. As illustrated in the figure, minimum allowable nozzle-to-nozzle distance Lmin represents the minimum distance among the respective two point-to-point distances within the pickup allowable range of two components P that can be simultaneously picked up. Maximum allowable nozzle-to-nozzle distance Lmax represents the maximum distance among the respective two point-to-point distances within the pickup allowable range of two components P that can be simultaneously picked up.

In a case where an affirmative determination (YES) is made in S520, CPU 101 determines that determination target nozzle set i is capable of simultaneous suction (S530), whereas in a case where a negative determination (NO) is made in S520, CPU 101 determines that determination target nozzle set i is not capable of simultaneous suction (S540). CPU 101 determines whether there are any nozzle sets that have not been determined (S550). If it is determined that there is the undetermined nozzle set, CPU 101 increments variable i (S560), the processing returns to S510, and CPU 101 determines whether the simultaneous suction is permitted for next determination target nozzle set i. On the other hand, if it is determined that there are no undetermined nozzle sets, CPU 101 displays a determination result on display 108 (S570), and terminates the simultaneous suction availability determination processing. FIG. 14 is an explanatory diagram illustrating an example of the determination result of the simultaneous suction availability determination. As illustrated in the drawing, the determination result includes a display of availability of the simultaneous suction for each nozzle set, and a remarks column indicating the reason in a case where the simultaneous suction is not permitted.

Here, the correspondence between the constituent elements of the embodiment and the constituent elements of the present disclosure described in the claims will be clarified. Component supply section 20 of the embodiment corresponds to a component supply section of the present disclosure, feeder 21 corresponds to a feeder, suction nozzle 44 corresponds to a pickup member, mounting head 40 corresponds to a mounting head, head moving device 30 corresponds to a moving device, control device 80 corresponds to a mounting control device, component mounter 10 corresponds to a component mounter, management device 100 corresponds to a suction position adjustment device, mark camera 28 corresponds to an imaging device, display 108 corresponds to a display device, and CPU 101 of management device 100 corresponds to a control device. Z-axis moving device 70 corresponds to a lifting and lowering device.

It goes without saying that the present disclosure is not limited to the above-described embodiments, and can be implemented in various aspects without departing from the technical scope of the present disclosure.

Figure 15:
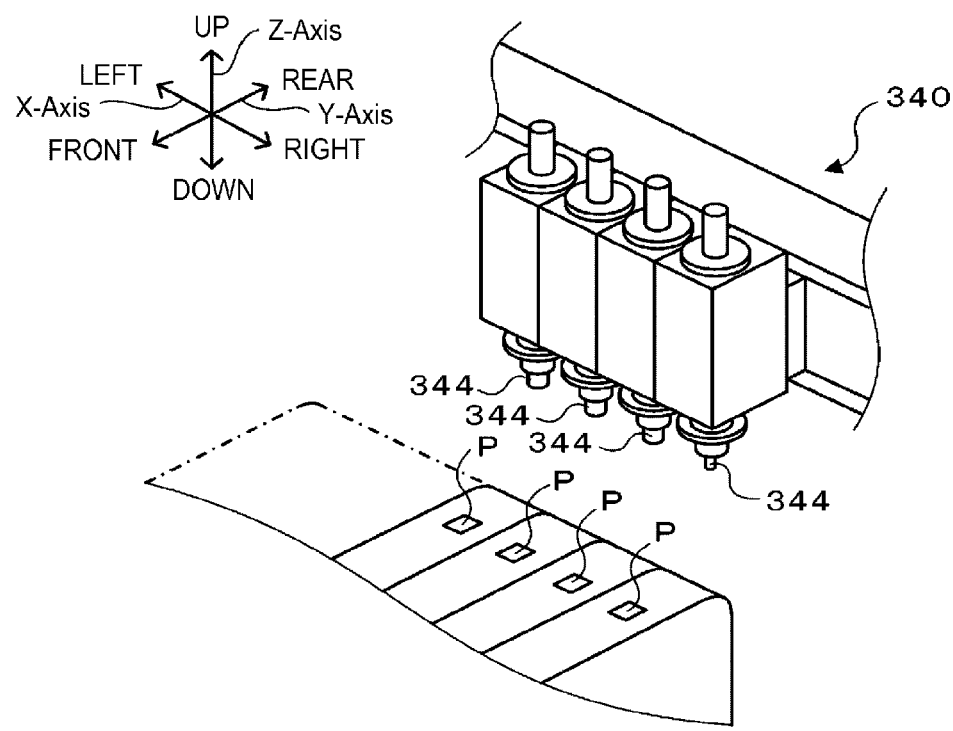
FIG. 15 is a schematic configuration view of a mounting head according to a modification example.

For example, in the above-described embodiments, component mounter 10 includes a rotary type mounting head 40 in which multiple nozzle holders 42 are arranged in the circumference direction with respect to head main body 41, However, as illustrated in FIG. 15, component mounter 10 may include parallel type mounting head 340 having multiple suction nozzles 344 that are arranged at the same pitch as multiple components P supplied from feeder 21 along the arrangement direction (X-direction) of feeder 21 and can be lifted and lowered independently of each other. Mounting head 340 may include multiple sets of such multiple suction nozzles 344.

In the above-described embodiments, mounting head 40 includes two Z-axis driving devices 70 that individually lift and lower each of two nozzle holders 42 (suction nozzles 44) at predetermined positions. However, mounting head 40 may include three or more Z-axis driving devices, or may be configured to simultaneously lower three or more suction nozzles by three or more Z-axis driving devices, so that three or more components P are simultaneously picked up by each suction nozzle.

As described above, the suction position adjustment device of the present disclosure for adjusting a target position of a head, which is used in a component mounter including a component supply section having multiple feeders for supplying components disposed at predetermined intervals to a supply position, the head having multiple pickup members for picking up the components, a lifting and lowering device capable of lifting and lowering the multiple pickup members at substantially same intervals as intervals of multiple components supplied from the multiple feeders, a moving device for moving the head along a plane orthogonal to a lifting and lowering direction of the pickup members, and a mounting control device capable of executing simultaneous suction control for controlling the moving device so that the head moves to a target position that is determined to locate the multiple pickup members on multiple components supplied from the multiple feeders, and controlling the lifting and lowering device so that the multiple pickup members are substantially simultaneously lowered, the suction position adjustment device including: an imaging device configured to image the supply position of the feeder from above; a display device configured to display a captured image that is captured by the imaging device; and a control device configured to control the imaging device so that an upper surface, at the supply position, in the multiple feeders of adjustment targets is imaged and display, on the display device, captured multiple upper surface images and multiple pointers superimposed on the multiple upper surface images.

According to the suction position adjustment device of the present disclosure, it is possible to appropriately adjust the target suction position used for the simultaneous suction control.

In such a suction position adjustment device according to the present disclosure, the control device may move positions of the multiple pointers displayed on the display device by a predetermined operation in the same direction by the same amount, and set the target position based on the positions of the pointers. Accordingly, it is possible to easily adjust the target position used for the simultaneous suction control on the screen of the display device.

In this case, the control device may display a pickup allowable range that is a range in which an upper surface of the component is capable of being picked up by the pickup member so as to be superimposed on the upper surface of the component recognized from the upper surface image at the supply position captured by the imaging device. Accordingly, since the operator can move the pointer while confirming the pickup allowable range, it is possible to more easily adjust the target position.

Further, in this case, the control device may display an error when a position of any one of the multiple pointers falls outside the corresponding pickup allowable range. Accordingly, it is possible to appropriately notify the operator of the availability of the simultaneous suction control.

In addition, in the suction position adjustment device according to the present disclosure, the head may have multiple sets of a pair of pickup members that are disposed at a predetermined interval and capable of being lifted and lowered, and the control device may determine whether the simultaneous suction control is capable of being executed by the pair of pickup members based on an interval of the pair of pickup members in consideration of a deviation amount of the interval of the pair of pickup members for each set. Accordingly, it is possible to appropriately cope with a tolerance and an assembly error of the head and the pickup member.

Further, in the suction position adjustment device of the present disclosure, the mounting control device may be capable of executing individual suction control for controlling the moving device so that the head moves to a target position that is determined to locate the pickup member on the component supplied from the feeder and controlling the lifting and lowering device so that the pickup member is lowered, and as the target position, a target position used for the simultaneous suction control and a target position used for the individual suction control may be respectively adjusted. Accordingly, by using different target positions for the simultaneous suction control and the individual suction control, it is possible to execute each control more appropriately.

In addition, in the suction position adjustment device according to the present disclosure, the imaging device may be provided so as to be movable together with the head by the moving device of the component mounter. Accordingly, since the imaging device provided in the component mounter can be used for the adjustment of the suction position, it is unnecessary to prepare a dedicated imaging device.

The present disclosure is not limited to the form of the suction position adjustment device, but may also be a form of a suction position adjustment method.

INDUSTRIAL APPLICABILITY

The present disclosure can be applied to a manufacturing industry of a suction position adjustment device or the like.

REFERENCE SIGNS LIST

1 component mounting system, 10 component mounter, 12 housing, 20 component supply section, 21 feeder, 22 tape reel, 23 tape, 23a cavity, 23b sprocket hole, 24 board conveyance device, 26 part camera, 28 mark camera, 30 head moving device, 31 X-axis guide rail, 32 X-axis slider, 33 Y-axis guide rail, 34 Y-axis slider, 36 X-axis motor, 37 X-axis position sensor, 38 Y-axis motor, 39 Y-axis position sensor, 40, 340 mounting head, 41 head main body, 42 nozzle holder, 44, 44A to 44H, 344 suction nozzle, 46 pressure adjustment valve, 50 R-axis driving device, 51 R-axis motor, 52 R-axis, 53 transmission gear, 55 R-axis position sensor, 60 Q-axis driving device, 61 Q-axis motor, 62 cylindrical gear, 62a external teeth, 64 Q-axis gear, 65 Q-axis position sensor, 70 Z-axis driving device, 71 Z-axis motor, 72 Z-axis slider, 73 Z-axis position sensor, 80 control device, 81 CPU, 82 ROM, 83 HDD, 84 RAM, 85 input and output interface, 86 bus, 100 management device, 101 CPU, 102 ROM, 103 HDD, 104 RAM, 105 input and output interface, 107 input device, 108 display, 200 adjustment screen, 201, 201a, 201b captured image, 202, 202a, 202b pointer, 203 operation button, 204 confirmation button, P component, S board

The invention claimed is:

1. A suction position adjustment device for adjusting a target position of a head, which is used in a component mounter including a component supply section having multiple feeders for supplying components disposed at predetermined intervals to a supply position, the head having multiple pickup members for picking up the components, a lifting and lowering device capable of lifting and lowering the pickup members at substantially same intervals as intervals of multiple components supplied from the multiple feeders, a moving device for moving the head along a plane orthogonal to a lifting and lowering direction of the pickup members, and a mounting control device capable of executing a simultaneous suction control for controlling the moving device so that the head moves to the target position that is determined to locate the pickup members on multiple components supplied from the multiple feeders, and controlling the lifting and lowering device so that the pickup members are substantially simultaneously lowered, the suction position adjustment device comprising:

an imaging device including a camera configured to image the supply position of the feeder from above;

a display device configured to display a captured image that is captured by the imaging device; and a control device configured to control the imaging device so that an upper surface of the components, at the supply position, in the multiple feeders of adjustment targets is imaged and display, on the display device, captured multiple upper surface images of the components and multiple pointers superimposed on multiple upper surface images, when the target position is adjusted.

2. The suction position adjustment device according to claim 1, wherein the control device moves positions of the multiple pointers displayed on the display device by a predetermined operation in a same direction by a same amount, and sets the target position based on the positions of the pointers.

3. The suction position adjustment device according to claim 2, wherein the control device displays a pickup allowable range that is a range in which the upper surface of the component is capable of being picked up by one of the pickup members so as to be superimposed on the upper surface of the component recognized from the upper surface image at the supply position captured by the imaging device.

4. The suction position adjustment device according to claim 3, wherein the control device displays an error when a position of any one of the multiple pointers falls outside a corresponding pickup allowable range.

5. The suction position adjustment device according to claim 1, wherein the head has multiple sets of a pair of the pickup members that are disposed at a predetermined interval and capable of being lifted and lowered, and the control device determines whether the simultaneous suction control is capable of being executed by the pair of the pickup members based on an interval of the pair of the pickup members in consideration of a deviation amount of the interval of the pair of the pickup members for each set.

6. The suction position adjustment device according to claim 1, wherein the mounting control device is capable of executing an individual suction control for controlling the moving device so that the head moves to the target position that is determined to locate one of the pickup members on the component supplied from the feeder and controlling the lifting and lowering device so that the one of the pickup members is lowered, and as the target position, a target position used for the simultaneous suction control and a target position used for the individual suction control are respectively adjusted.

7. The suction position adjustment device according to claim 1, wherein the imaging device is provided so as to be movable together with the head by the moving device of the component mounter.

8. A suction position adjustment method for adjusting a target position of a head, which is used in a component mounter including a component supply section having multiple feeders for supplying components disposed at predetermined intervals to a supply position, the head having multiple pickup members for picking up the components, a lifting and lowering device capable of lifting and lowering the pickup members at substantially same intervals as intervals of multiple components supplied from the multiple feeders, a moving device for moving the head along a plane orthogonal to a lifting and lowering direction of the pickup members, and a mounting control device capable of executing a simultaneous suction control for controlling the moving device so that the head moves to the target position that is determined to locate the pickup members on multiple components supplied from the multiple feeders, and controlling the lifting and lowering device so that the pickup members are substantially simultaneously lowered, the suction position adjustment method comprising:

imaging an upper surface, at the supply position, in the multiple feeders of adjustment targets and displaying obtained multiple upper surface images and multiple pointers superimposed on multiple upper surface images, when the target position is adjusted.

* * * * *